United States Patent
Lee

(10) Patent No.: US 8,364,109 B2
(45) Date of Patent: Jan. 29, 2013

(54) RECEIVER

(75) Inventor: Ching-Feng Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 781 days.

(21) Appl. No.: 12/536,644

(22) Filed: Aug. 6, 2009

(65) Prior Publication Data

US 2010/0291890 A1 Nov. 18, 2010

(30) Foreign Application Priority Data

May 14, 2009 (TW) ................................ 98116066 A

(51) Int. Cl.
*H04B 1/06* (2006.01)
*H04K 3/00* (2006.01)

(52) U.S. Cl. ................ 455/241.1; 455/245.2; 455/253.2

(58) Field of Classification Search .... 455/234.1–234.2, 455/240.1, 241.1, 245.2, 253.2; 330/51, 330/124 R; 375/345
See application file for complete search history.

(56) References Cited

U.S. PATENT DOCUMENTS

| 5,161,170 | A | 11/1992 | Gilbert et al. |
| 6,049,251 | A | 4/2000 | Meyer |
| 7,085,334 | B2 | 8/2006 | Burke |
| 7,088,794 | B2 | 8/2006 | Nichols |
| 7,382,296 | B2 | 6/2008 | Delanghe |
| 8,032,099 | B2 * | 10/2011 | Chang ........................ 455/234.1 |
| 8,055,229 | B2 * | 11/2011 | Huang ........................ 455/232.1 |
| 2006/0084469 | A1 | 4/2006 | Malone et al. |
| 2009/0111415 | A1 | 4/2009 | Chang |

OTHER PUBLICATIONS

Taiwanese language office action dated Oct. 26, 2012.

* cited by examiner

*Primary Examiner* — Lee Nguyen
(74) *Attorney, Agent, or Firm* — McClure, Qualey & Rodack, LLP

(57) ABSTRACT

A receiver including an amplifier module, a control unit, a mixer and an IF amplifier is provided. The amplifier module, including multiple amplifier units with different gains, amplifies an input signal. The control unit enables at least one of the amplifier units according to a gain control signal, wherein the enabled at least one amplifier unit generates an output RF signal in response to the input signal. The mixer coupled with each amplifier unit in series down-converts the output RF signal into an IF signal according to a local oscillation frequency. The IF amplifier having a variable gain is coupled to the mixer for amplifying the IF signal to an output signal according to the gain control signal. The control unit obtains the gain control signal according to the output signal and a reference signal.

9 Claims, 9 Drawing Sheets

RECEIVER

This application claims the benefit of Taiwan application Serial No. 98116066, filed May 14, 2009, the subject matter of which is incorporated herein by reference.

BACKGROUND

1. Technical Field

The disclosure relates in general to a receiver, and more particularly to a receiver with a wide-dynamic-range variable gain.

2. Description of the Related Art

In the field of telecommunication, the receiver for receiving signals normally uses a dynamic amplifier to amplify the received signal. When the amplitude of the received input signal changes, the gain of the dynamic amplifier also changes accordingly to maintain the intensity of the output signal.

FIG. 1 is a circuit diagram showing a conventional dynamic amplifier utilizing a current steering circuit. Referring to FIG. 1, the dynamic amplifier 100 uses a current steering circuit 140 to adjust the gain of the dynamic amplifier 100 according to the voltage of a control signal $V_{CTL}$. When the amplitude of the input signal $V_i$ raises, the voltage of the control signal $V_{CTL}$ lowers so as to reduce the magnitude of the output current $i_o$, thereby reducing the gain of the dynamic amplifier 100. However, when the amplitude of the input signal $V_i$ is too large, the transistors $Q_{121}$ and $Q_{122}$ Of the differential amplifier 120 are operated within a saturation region, making the output signal distorted. Despite the magnitude of the output current $i_o$ is reduced, the distortion problem in the waveform of the output current $i_o$ still remains unresolved. Thus, the conventional dynamic amplifier 100 has the disadvantage that the level of linearity still cannot meet the requirement. Here, linearity refers to the range of amplitude of the input signal which does not generate a distorted output signal.

In order to increase the level of linearity, a conventional dynamic amplifier with degenerating resistance tuning is provided, and the circuit diagram of a degenerating resistance circuit is shown in FIG. 2. The degenerating resistance tuning is implemented by a metal oxide semiconductor field-effect transistor (MOS transistor). The dynamic amplifier 200 controls the control voltage $V_{CTL}'$ at the gate of the field-effect transistor 240 to change the equivalent resistance of the conducted field-effect transistor 240 so as to adjust the gain of the dynamic amplifier 200. Thus, the range of amplitude of the receivable input signal which does not make the dynamic amplifier 200 generate a distorted output signal is increased, so as to increase the dynamic range of the dynamic amplifier 200. The gain of the dynamic amplifier 200 is related to the impedance value of the field-effect transistor 240. When the frequency of the input signal $V_i$ is too high, the parasitic capacitance of the degenerating resistance circuit affects the gain more seriously, so that the gain of the dynamic amplifier 200 cannot be precisely controlled when the frequency is too high. Meanwhile, the linearity of the dynamic amplifier 200 is also hard to control when receiving a high-frequency input signal.

To resolve the above control problem of the linearity of the dynamic amplifier 200, a wide-dynamic-range variable-gain amplifier circuit is disclosed in U.S. Pat. No. 6,049,251. As indicated in FIG. 3A, a circuit diagram of a wide-dynamic-range variable-gain amplifier circuit according to U.S. Pat. No. 6,049,251 is shown. The wide-dynamic-range variable-gain amplifier 300 includes two amplifier circuits 320 and 340. FIGS. 3B and 3C respectively show circuit diagrams of the amplifier circuit 320 and the amplifier circuit 340 of FIG. 3A. Referring to FIG. 3B, the resistor $R_{E1}$ has smaller resistance, so the amplifier circuit 320 has large gain but low level of linearity. Referring to FIG. 3C, the resistor $R_{E2}$ has larger resistance, so the amplifier circuit 340 has small gain but high level of linearity. The amplifier circuits 320 and 340 are coupled in parallel, and the gains of the amplifier circuits 320 and 340 are respectively controlled by the automatic gain control signals AGC1 and AGC2. As the amplifier circuits 320 and 340 have different gains, so the amplifier with two different levels of linearity can be implemented and the wide-dynamic range can be achieved. However, in order to increase the range of the acceptable input signal, at least one more amplifier circuit needs to be coupled in parallel, not only increasing the required elements and cost but also increasing the complexity of the entire circuit.

Moreover, a discrete automatic gain control mechanism is disclosed in U.S. Pat. No. 5,161,170. Despite the discrete automatic gain control mechanism adopts discrete digitization technology to avoid using huge and expensive analog elements as many as possible, some analog elements are still necessary in order to lock the output signal power to a constant level. Thus, an automatic gain control mechanism for digitized RF signal processing is disclosed in U.S. Pat. No. 7,088794. FIG. 4 shows a circuit diagram of a digital automatic gain control signal controller according to U.S. Pat. No. 7,088,794. Referring to FIG. 4, the digital automatic gain control signal controller 400 utilizes an analog-to-digital converter 440 to convert an analog input signal into a digital signal. Then, a signal detection logic unit 460 judges the level of the digital signal and accordingly controls a signal detection logic unit 460 by feedback control to determine the attenuation level of the analog input signal.

In addition, an automatic gain control system is also disclosed in U.S. Pat. No. 7,085,334. The automatic gain control system uses an analog-to-digital converter to convert an analog input signal into a digital signal. Then, a post-stage digital signal processing (DSP) circuit operates the digital signal to accordingly control the analog gain device to receive the analog input signal by feedback control. Moreover, a mixed analog-digital automatic gain control (AGC) circuit is disclosed in U.S. Pat. No. 7,382,296. The mixed analog-digital AGC circuit also utilizes an analog-to-digital converter to convert an analog the input signal into a digital signal, which a post-stage circuit determines and controls the gain of an analog amplifier by feedback control according to. However, the above technologies of converting an analog input signal into a digital signal have to employ a multi-bit analog-to-digital converter, and are inconvenient in the sampling when the input signal is a high-frequency signal. Thus, the above circuits are hard to implement.

Therefore, how to increase the range of the input signal acceptable to the amplifier without increasing circuit complexity has become a focus to the manufacturers.

SUMMARY

Consistent with the invention, there is provided a receiver capable of increasing the dynamic range of the input signal acceptable to the receiver, reducing the required circuit elements and decreasing the circuit complexity.

Consistent with the invention, there is provided a receiver including an amplifier module, a control unit, a mixer and an IF amplifier is provided. The amplifier module, including multiple amplifier units with different gains coupled in parallel, amplifies an input signal. The control unit enables at least one of the amplifier units according to a gain control signal, wherein the enabled at least one amplifier unit generates an output RF signal in response to the input signal. The mixer is coupled with each amplifier unit in series and down-converts the output RF signal to an IF signal according to a local oscillation frequency. The IF amplifier has a variable gain and is coupled to the mixer for amplifying the IF signal to an output signal according to the gain control signal under the control of the control unit. Wherein, the control unit obtains the gain control signal according to the output signal and a reference signal.

It is to be understood that both the foregoing general description and the following detailed description are exemplary and explanatory only and are not restrictive of the invention, as claimed.

DETAILED DESCRIPTION

In exemplary embodiments consistent with the present invention, there is provided a receiver, which controls and moderates the amplifier module and the IF amplifier by use of the automatic gain control method, so that the receiver has step gain variety and continuous gain variety at the same time, and has hysteresis protection as well, not only increasing the dynamic range of the input signal acceptable to the receiver and enhancing its disturbance immunity but also reducing the required circuit elements and decreasing the circuit complexity.

Figure 1:
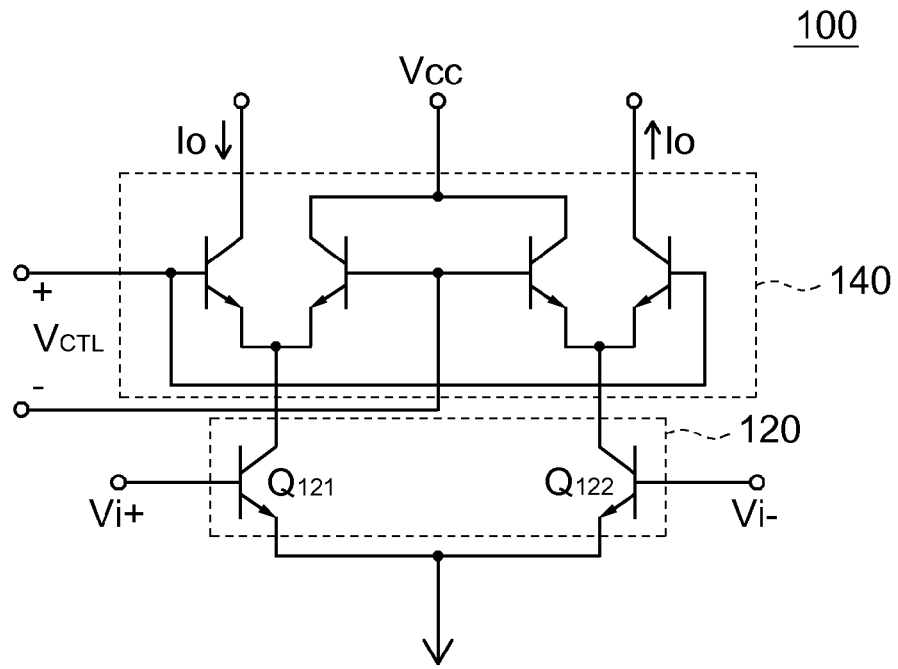
FIG. 1 shows a circuit diagram of a conventional dynamic amplifier utilizing a current steering circuit.
Figure 2:
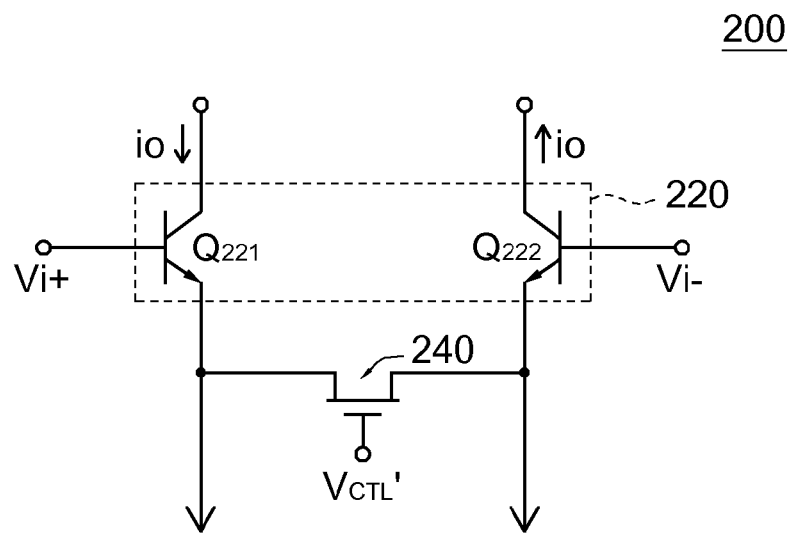
FIG. 2 shows a circuit diagram of a conventional dynamic amplifier with degenerating resistance tuning.
Figure 3A:
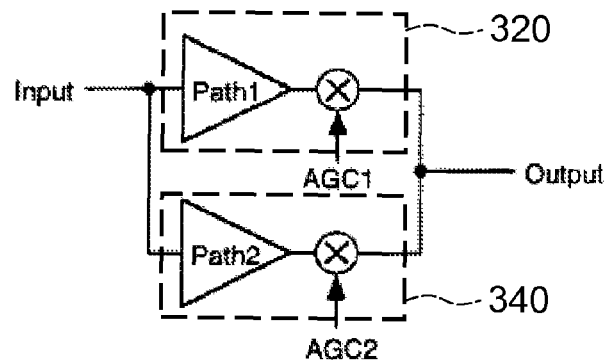
FIG. 3A shows a circuit diagram of a wide-dynamic-range variable-gain amplifier circuit according to U.S. Pat. No. 6,049,251.
Figure 3B:
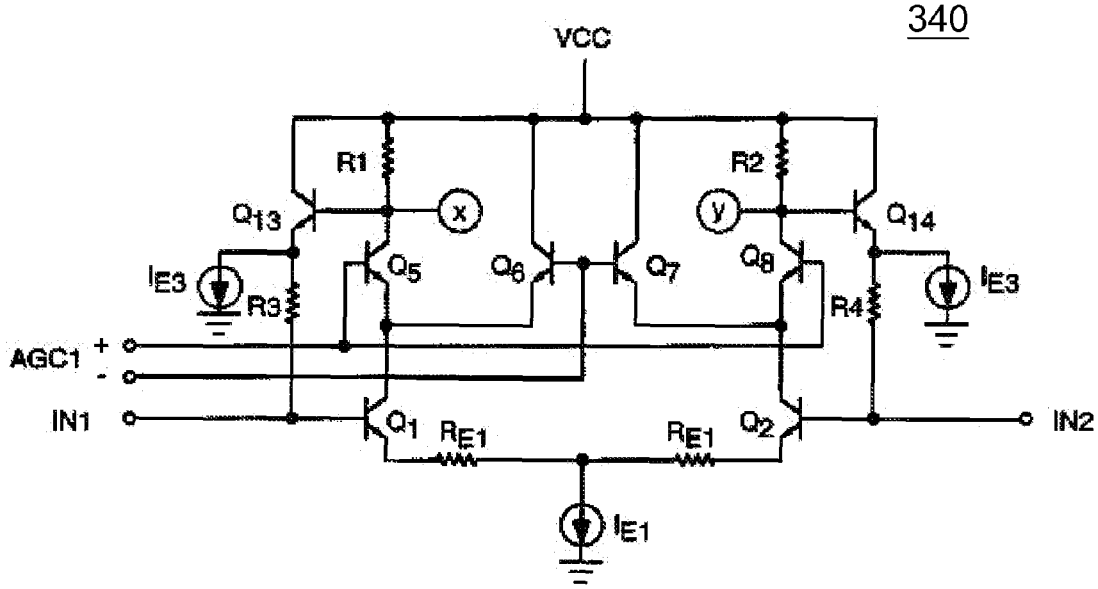
FIGS. 3B-3C respectively show circuit diagrams of the amplifier circuit 320 and the amplifier circuit 340 of FIG. 3A.
Figure 3C:
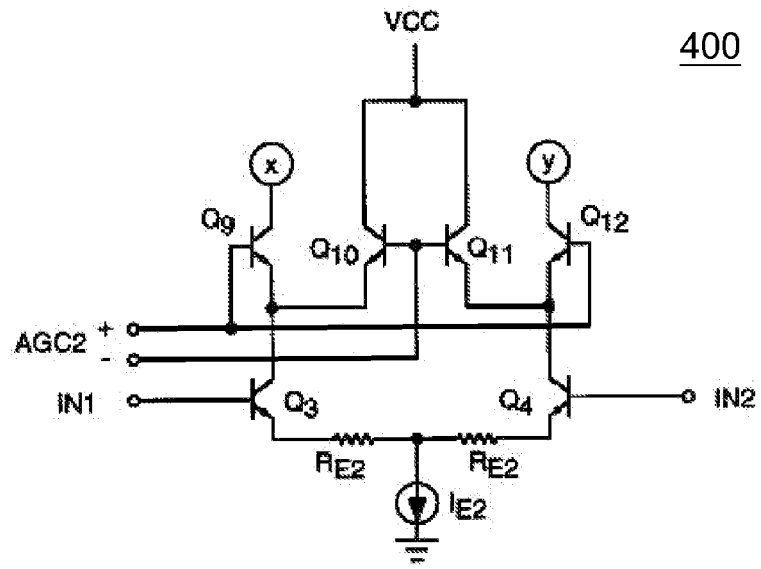
Figure 4:
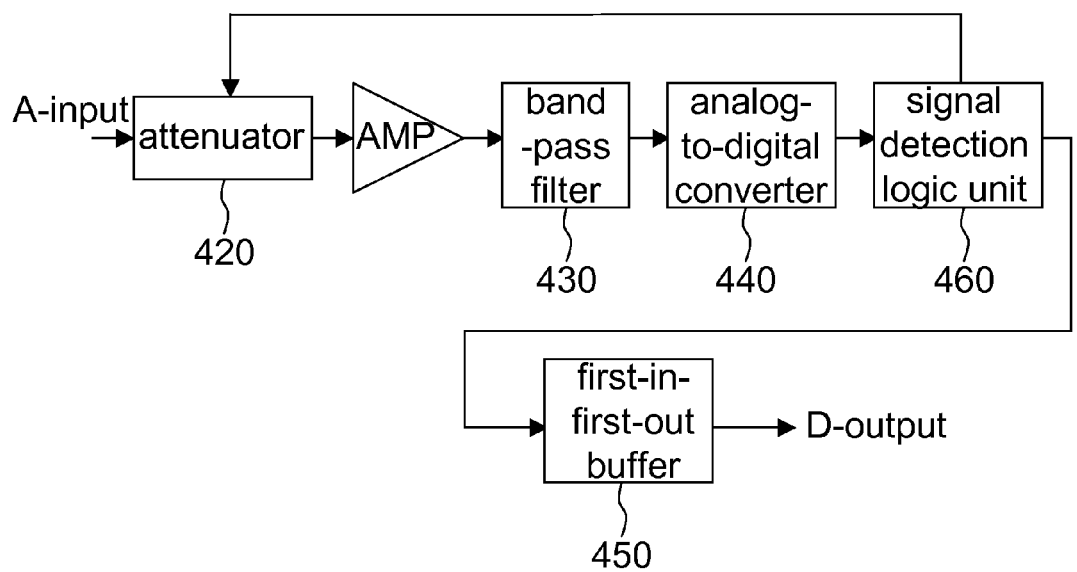
FIG. 4 shows a circuit diagram of a digital automatic gain control signal controller according to U.S. Pat. No. 7,088,794.
Figure 5:
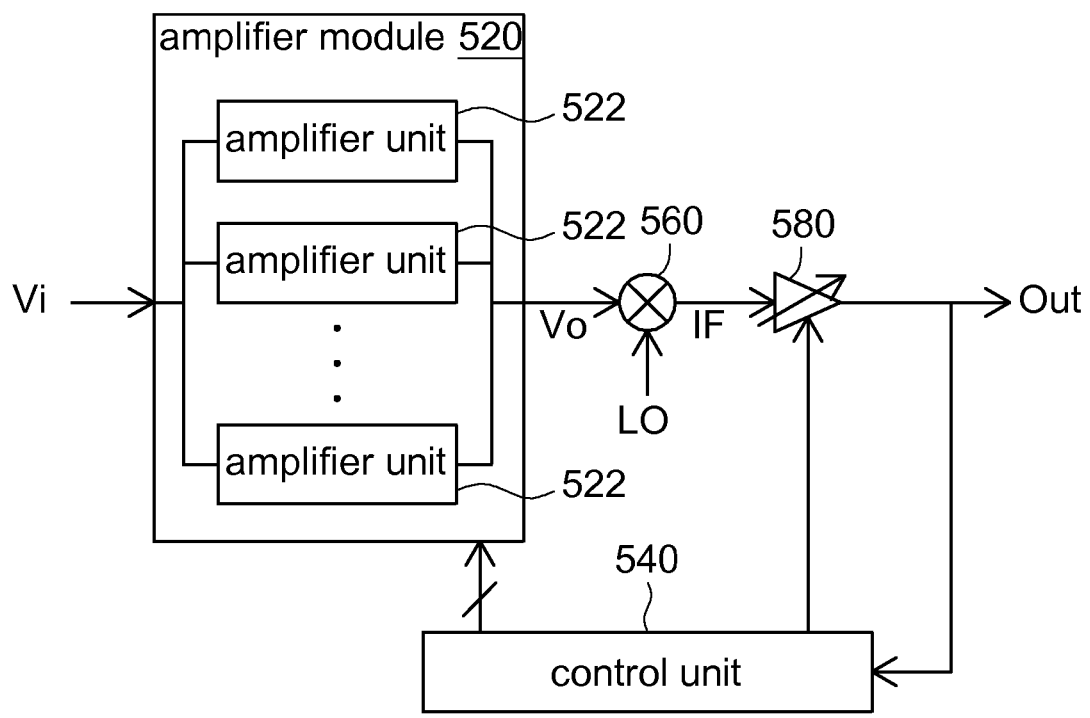
FIG. 5 shows a block diagram of a receiver according to an exemplary embodiment consistent with the invention.

FIG. 5 is a block diagram of a receiver according to an exemplary embodiment consistent with the invention. Referring to FIG. 5, the receiver 500 includes an amplifier module 520, a control unit 540, a mixer 560 and an IF amplifier 580. The amplifier module 520 amplifies an input signal Vi, wherein the input signal Vi is an RF (RF) signal for example. The amplifier module 520 includes multiple amplifier units 522 coupled in parallel, wherein the gains of the amplifier units 522 are different. The control unit 540 enables at least one of the amplifier units 522 according to a gain control signal, and the enabled at least one amplifier unit 522 generates an output RF signal Vo in response to the input signal Vi.

The mixer 560 is coupled with each of the amplifier units 522 in series for down-converting the output RF signal Vo to an IF signal IF according to a local oscillation frequency LO, for example, provided by a local oscillator. The IF amplifier 580 has a variable gain and is coupled to the mixer 560. The IF amplifier 580 amplifies the IF signal IF to an output signal Out according to the gain control signal under the control of the control unit 540. The output signal Out can be transmitted to the post-stage circuit for demodulation or other processing. The control unit 540 obtains the gain control signal according to the output signal Out and a reference signal.

In the present embodiment of the invention, multiple amplifier units 522 coupled in parallel incorporate with the IF amplifier 580 with a variable gain, and the control unit 540, according to the comparison between the gain control signal and the gain threshold signal, controls different amplifier units 522 and incorporates with the IF amplifier 580, so that the receiver 500 allows the amplitude range of the input signal Vi not distorting the output signal Out to be increased. That is, the entire dynamic range of the receiver 500 is increased. Besides, according to the receiver 500 of the invention, each of the amplifier units 522 incorporates with the IF amplifier 580 with a variable gain. As the ordinary receiver normally has an IF amplifier, the receiver 500 of the invention does not require extra amplifier circuits, hence effectively simplifying the circuit design. Thus, the present embodiment of the invention achieves a wide-dynamic-range amplifier, and at the same time either simplifies the circuit design or decreases the required circuit elements to reduce the manufacturing cost.

Figure 6:
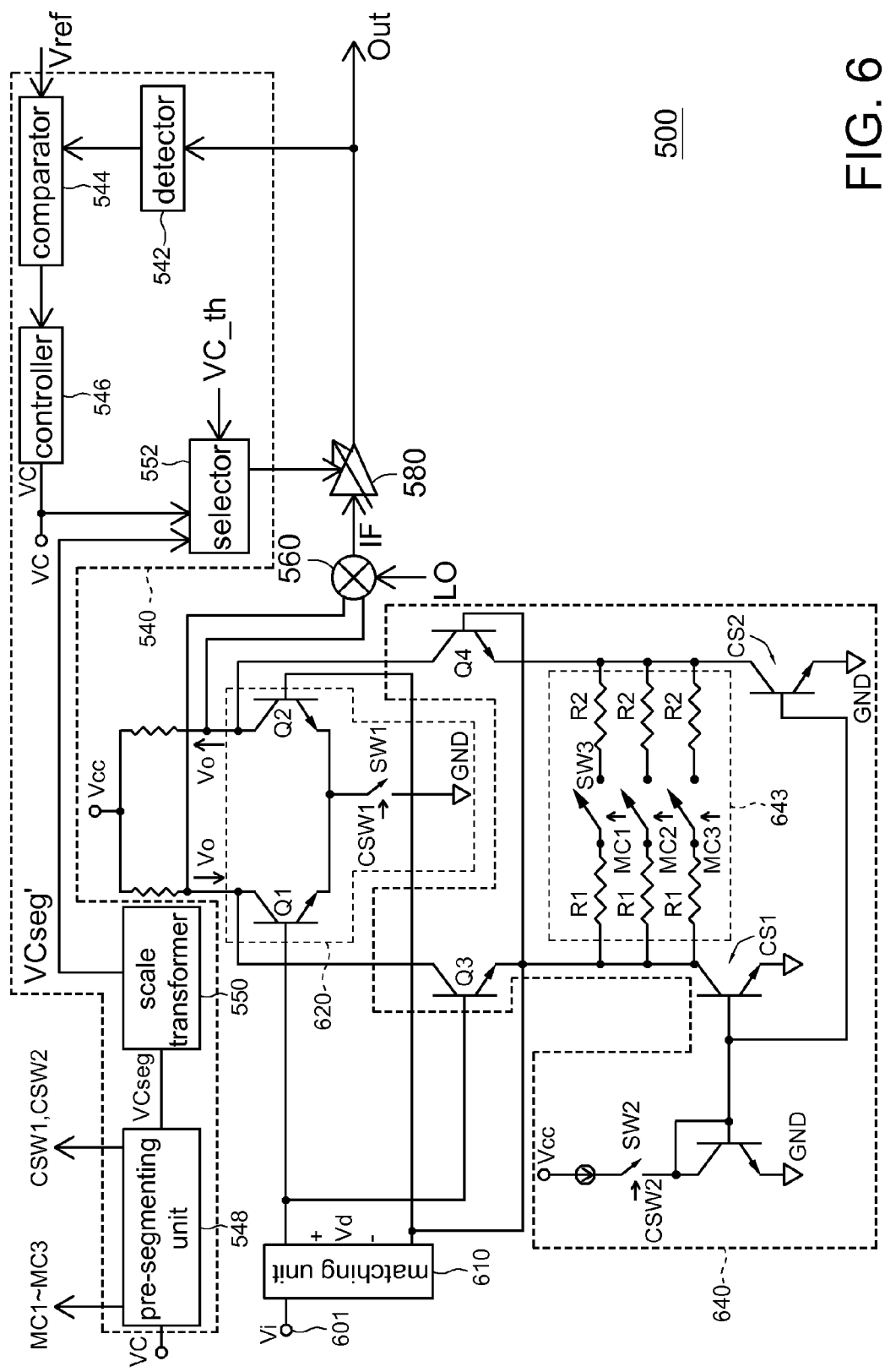
FIG. 6 shows a circuit diagram of an example of the receiver of FIG. 5.

FIG. 6 is a circuit diagram of an example of the receiver of FIG. 5. Referring to FIG. 6, the amplifier module 520 includes two amplifier circuits 620 and 640 and a selection unit. The amplifier circuit 620 includes a first differential amplifier used for amplifying the input signal Vi. The amplifier circuit 640 includes a current source unit, a second differential amplifier and a resistor module 643. The second differential amplifier amplifies the input signal Vi. The second differential amplifier is coupled to the current source unit, and the resistor module 643 is coupled to the second differential amplifier.

The resistor module 643 includes multiple major resistors R1 and R2 and multiple major switches SW3. Each major switch SW3 is selectively conducted under the control of the control unit 640, and the conducted major switch SW3 makes currents flow through the corresponding major resistors R1 and R2. The gain of the second differential amplifier is related to the resistance of the major resistors R1 and R2 that the currents flow through. The selection unit enables one of the first differential amplifier and the second differential amplifier under the control of the control unit 640, so that the enabled first differential amplifier or the enabled second differential amplifier outputs the output RF signal Vo corresponding to the input signal Vi.

The receiver 500 further includes a signal input end 601 and a matching unit 610. The signal input end 601 is used for receiving the input signal Vi. When the input signal Vi is a single-end input signal such as an RF signal for example, the matching unit 610 transforms the single-end input signal Vi into a double-end differential input signal Vd, and makes the input end 601 impedance match with the next-stage circuits of the matching unit 610. The matching unit 610 is implemented by a balance to unbalance transformer (BALUN) for example. The first differential amplifier and the second differential amplifier process the differential input signal Vd transformed from the input signal Vi.

The first differential amplifier of the amplifier circuit 620 has two transistors Q1 and Q2 whose bases are used for receiving the differential input signal Vd, emitters are both coupled to a grounding voltage GND, and collectors are both coupled to a working voltage Vcc. The current source unit of the amplifier circuit 640 includes two current sources CS1 and CS2, which are implemented by current mirrors. The second differential amplifier includes two transistors Q3 and Q4 whose bases are used for receiving the differential input signal Vd, emitters are respectively coupled to the current sources CS1 and CS2, and collectors are both coupled to the supply voltage Vcc.

The emitter of the transistor Q3 is further coupled to multiple major resistors R1, and the emitter of the transistor Q4 is further coupled to multiple major resistors R2. Each major resistor R1 is electrically connected to one major resistor R2 through one major switch SW3. The collectors of the transistors Q1 and Q2 are respectively coupled to the collectors of the transistors Q3 and Q4, and the collectors of the transistors Q1 and Q2 are used for outputting the output RF signal Vo. The above selection unit includes two enable switches SW1 and SW2, wherein the enable switch SW1 is electrically connected to the emitters of the transistors Q1 and Q2, and the enable switch SW2 is electrically connected to the current mirror. The emitters of the above transistors Q1 and Q2 can also be coupled to a current source. However, in the present embodiment of the invention, the emitters of the transistors Q1 and Q2 are both coupled to a grounding voltage GND as exemplified.

The receiver 500 may further include a DC bias isolation circuit and a bias circuit (not illustrated). The DC bias isolation circuit may be coupled between the matching unit 610 and the amplifier module 520. The DC bias isolation circuit is used for isolating the voltage between the bases of the transistors Q1 and Q2 and the bases of the transistors Q3 and Q4, hence benefiting the fast switch between the amplifier circuits 620 and 640 and reducing the response time of the transient state. The bias circuit provides a DC bias to the bases of the transistors Q1 to Q4.

The control unit 540 includes a detector 542, a comparator 544, a controller 546, a pre-segmenting unit 548, a scale transformer 550 and a selector 552. The detector 542 is coupled to the IF amplifier 580 to detect and obtain the voltage level of the output signal Out. The comparator 544 is coupled to the detector 542 to compare the voltage level of the reference signal Vref with that of the output signal Out, wherein the comparator 544 is a subtractor for example. The controller 546 is coupled to the comparator 542 to generate a gain control signal VC according to the comparison between the voltage levels of the reference signal Vref and the output signal Out. The controller 546 is an integrator for example but is not limited thereto.

The pre-segmenting unit 548 receives the gain control signal VC from the controller 546, and generates a segment tuning control signal VCseg according to the gain control signal VC. The scale transformer 550 is coupled to the pre-segmenting unit 548 to adjust the segment tuning control signal VCseg, so that the slope of the segment tuning control signal VCseg is not smaller than the slope of the gain variation of the IF amplifier 580. The selector 552 receives the gain control signal VC from the controller 546 and receives the adjusted segment tuning control signal VCseg' from the scale transformer 550. When the gain control signal VC is smaller than a gain threshold signal VC_th, the selector 552 outputs the segment tuning control signal VCseg' for controlling the IF amplifier 580 to amplify the IF signal IF. When the gain control signal VC is larger than the gain threshold signal VC_th, the selector 552 outputs the gain control signal VC for controlling the IF amplifier 580 to amplify the IF signal IF.

The operation of the receiver 500 is disclosed below. The control unit 540 outputs the switch control signals CSW1 and CSW2 according to the gain control signal VC for respectively controlling the switches SW1 and SW2 to select at least one of the amplifier circuits 620 and 640. If the control unit 540 selects the amplifier circuit 640, then the control unit 540 further outputs multiple enable signals to control the major switches. In the present embodiment of the invention, the resistor module 643 includes three pairs of major resistors R1 and R2 and three major switches SW3, wherein the major resistors R1 and R2 have different resistances, and the major switches SW3 are controlled by the three enable signals MC1~MC3 outputted from the control unit 540. By conducting one major switch SW3 or conducting two or more major switches SW3 at the same time, the resistor module 643 has different equivalent resistances. The resistor module 643 with different equivalent resistances enables the amplifier circuit 640 to be equivalent to many amplifier units 522 with different gains as indicated in FIG. 5.

The gain control signal VC received by the control unit 540 changes along with the amplitude of the input signal Vi. For example, when the amplitude of the input signal Vi rises, the voltage of the gain control signal VC becomes smaller, so that the control unit 540 selects the amplifier unit 522 whose gain is smaller. That is, if the input signal Vi has the smallest amplitude, the control unit 540 conducts the enable switch SW1 but does not conduct the enable switch SW2 so as to enable the amplifier circuit 620 and disenable the amplifier circuit 640. Meanwhile, the gain of the amplifier module 520 is substantially equal to the gain of the amplifier circuit 620, and the amplifier module 520 has the largest gain but the lowest level of linearity.

When the amplitude of the input signal Vi gradually rises, the control unit 540 does not conduct the enable switch SW1 but conduct the enable switch SW2 so as to enable the amplifier circuit 640 and disenable the amplifier circuit 620. Moreover, the control unit 540 uses the gain control signal VC to conduct a part of the major switches SW3 so as to obtain the gain of the amplifier circuit 640 corresponding to the input signal Vi. Meanwhile, the gain of the amplifier module 520 is the gain of the amplifier circuit 640. The gain of the amplifier module 520 becomes smaller but the level of linearity becomes higher. Thus, when the amplitude of the input signal Vi is the largest, the resistor module 643 is controlled to have the largest equivalent resistance, so that the amplifier circuit 640 has the smallest gain but the highest level of linearity. Consequently, the resistor module 643 is designed according the amplitude range of the input signal Vi, so that there are corresponding gains within the range that can be used to amplify the input signal Vi and avoid distortion, hence achieving a wide-dynamic-range gain adjustment.

Figure 7:
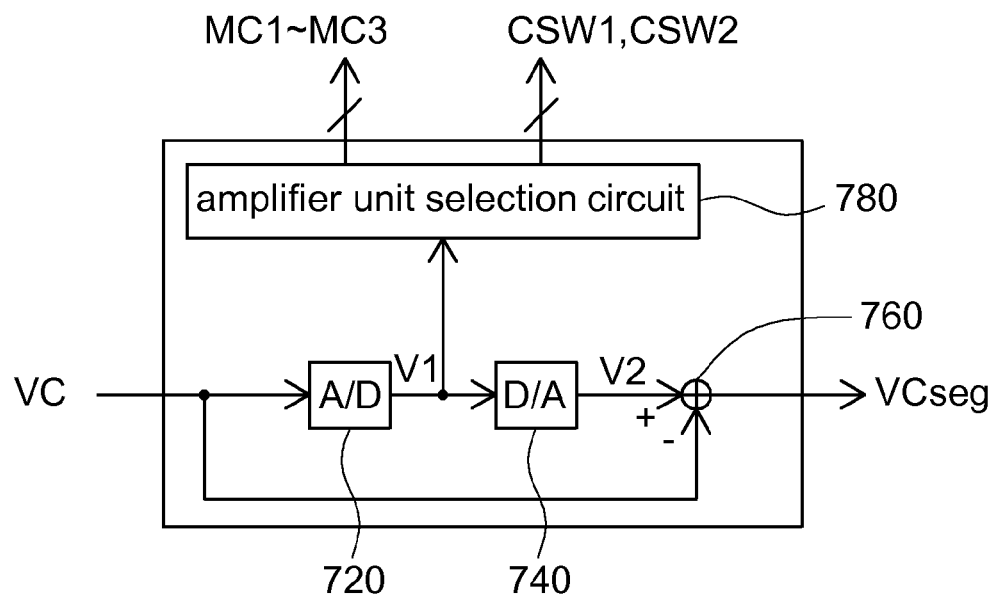
FIG. 7 shows a circuit diagram of an example of the pre-segmenting unit 548 of FIG. 6.

FIG. 7 is a circuit diagram of an example of the pre-segmenting unit 548 of FIG. 6. Referring to FIG. 7, the pre-segmenting unit 548 includes an analog/digital converter 720, a digital/analog converter 740, a subtractor 760 and an amplifier unit selection circuit 780. The analog/digital converter 720 is used for converting a gain control signal VC to a first signal V1. The digital/analog converter 740 is used for converting the first signal V1 to a second signal V2. The subtractor 760 is used for subtracting the gain control signal VC by the second signal V2 to obtain the segment tuning control signal VCseg. The amplifier unit selection circuit 780 is used for correspondingly outputting multiple enable signals MC1~MC3, CSW1 and CSW2 according to the intensity of the signal V1 to conduct at least one major switch SW3, and conduct the enable switch SW1 or SW2.

The pre-segmenting unit 548 generates the segment tuning control signal VCseg according to the gain control signal VC. When the gain control signal VC linearly increases or decreases along with the linear change in the intensity (dB value or absolute value) of the input signal Vi, the waveform of the segment tuning control signal VCseg with respect to the intensity (dB value or absolute value) of the input signal Vi is substantially a sawtooth wave. The segment tuning control signal VCseg is adjusted by the scale converter 550, and the waveform of the adjusted segment tuning control signal VCseg' is a sawtooth wave with hysteresis.

The receiver 500 is substantially used for maintaining the intensity of the output signal Out when the amplitude of the received input signal Vi changes. Therefore, the control unit 540 utilizes the comparator 544 to compare the voltage level of the reference signal Vref with that of the output signal Out. When the voltage level of the output signal Out is larger than that of the reference signal Vref (that is, the input signal Vi has larger amplitude), the voltage of the gain control signal VC outputted by the controller 546 becomes smaller, so that the control unit 540 selects the amplifier unit 522 which gain is smaller. When the voltage level of the output signal Out is smaller than that of the reference signal Vref (that is, the input signal Vi has smaller amplitude), the voltage of the gain control signal VC outputted by the controller 546 becomes larger, so that the control unit 540 selects the amplifier unit 522 which gain is larger.

When the gain control signal VC is smaller than the gain threshold signal VC_th, the selector 552 outputs the adjusted segment tuning control signal VCseg', and the IF amplifier 580 amplifies the IF signal IF according to the adjusted segment tuning control signal VCseg'. Consequently, the step gains provided by the amplifier module 520 maintain continuity because of the variable gain of the IF amplifier 580. Besides, when the gain control signal VC is larger than the gain threshold signal VC_th, this implies that the amplitude of the input signal Vi is too small, and the equivalent gain of the amplifier module 520 has been the largest but is still not sufficient to maintain the intensity of the output signal Out. Therefore, the selector 552 outputs the gain control signal VC, and the IF amplifier 580 amplifies the IF signal IF according to the gain control signal VC. Meanwhile, the overall gain of the receiver 500 is substantially the sum of the largest gain of the amplifier module 520 and the gain of the IF amplifier 580.

Figure 8:
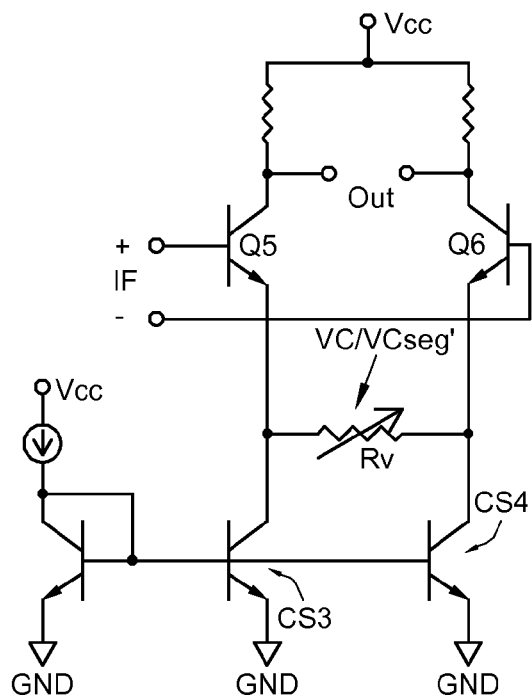
FIG. 8 shows a circuit diagram of an example of the IF amplifier 580 of FIG. 6.

The IF amplifier 580 with a variable gain is implemented by a differential amplifier, a variable resistor and current sources as exemplified, but is not limited thereto. FIG. 8 is a circuit diagram of an example of the IF amplifier 580 of FIG. 6. Referring to FIG. 8, the current source unit of the IF amplifier 580 includes two current sources CS3 and CS4, which are implemented by current mirrors. The differential amplifier includes two transistors Q5 and Q6 whose bases are used for receiving the IF signal IF and emitters are respectively coupled to the current sources CS3 and CS4. The differential amplifier is used for amplifying the IF signal and coupled to the current source unit. The variable resistor Rv is coupled between the emitters of the transistors Q5 and Q6 and used for adjusting the gain of the IF amplifier 580 according to the gain control signal VC or the adjusted segment tuning control signal VCseg'.

Figure 9A:
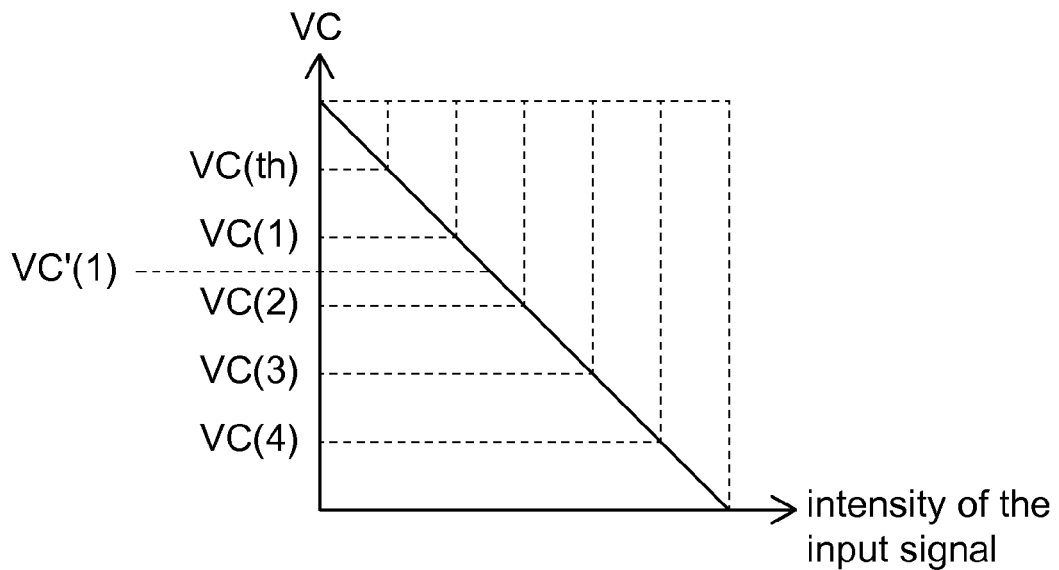
FIG. 9A and 9B show waveforms of an example of a gain control signal VC and a segment tuning control signal VCseg of the pre-segmenting unit 548 of FIG. 6.
Figure 9B:
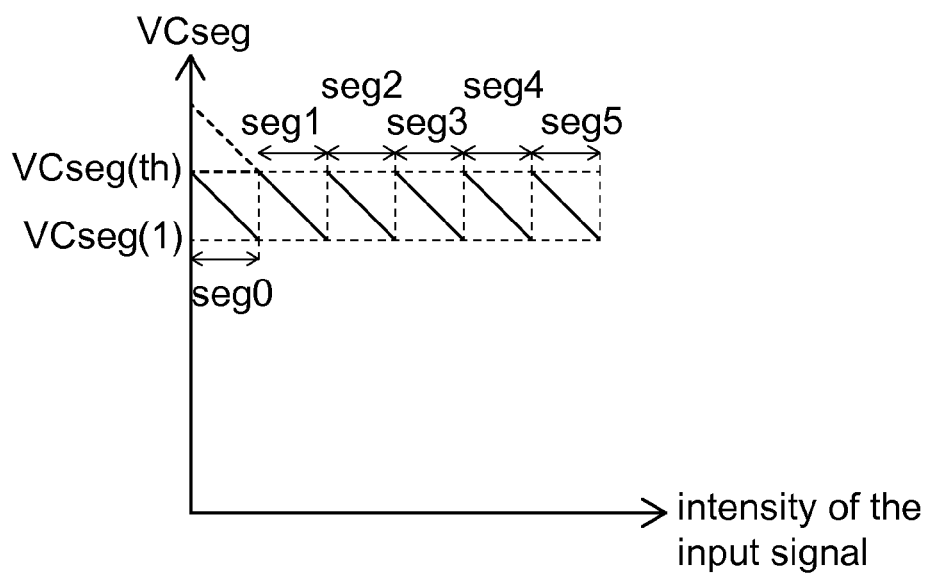

Referring to FIGS. 9A and 9B, two waveforms of an example of a gain control signal VC and a segment tuning control signal VCseg of the pre-segmenting unit 548 of FIG. 6 are shown. In FIG. 9A, when the gain control signal VC increases or decreases linearly along with the linear change in the intensity (dB value or absolute value) of the input signal Vi, the waveform of the segment tuning control signal VCseg with respect to the input intensity (dB value or absolute value) is substantially a sawtooth wave as indicated in FIG. 9B. In FIG. 9B, the segment tuning control signal VCseg is divided into six segments seg0~seg5 as exemplified.

For the six segments of FIG. 9B, the segment tuning control signal VCseg only controls five amplifier units 522 with different gains respectively. When the gain control signal VC is smaller than the gain threshold signal VC_th, the voltage value of the gain control signal VC is lowered from the voltage VC (th) of the gain threshold signal VC_th, the amplifier unit 522 corresponding to the segment seg1 is selected, and the voltage value of the segment tuning control signal VCseg is also lowered from the VCseg(th). When the voltage value of the gain control signal VC is lowered to the voltage VC(1), the amplifier unit 522 corresponding to the segment seg2 is selected, and the voltage value of the segment tuning control signal VCseg is still lowered down from the voltage VCseg (th). The operations for the segments seg3 to seg5 are similar to the operations disclosed above.

The advantage of the above operations is that when different amplifier units 522 are switched as the intensity of the gain control signal VC changes, the gain of the selected amplifier unit 522 starts to lower from the largest gain of the segment. Thus, the variable range of the overall gain of the amplifier module 520 is increased. Moreover, when the gain control signal VC is larger than the gain threshold signal VC_th, the amplifier module 520 still selects the amplifier unit 522 corresponding to the segment seg1. Meanwhile, the IF amplifier 580 is controlled by the gain control signal VC to amplify the IF signal IF, but is not related to the segment tuning control signal VCseg.

Furthermore, the scale transformer 550 adjust the segment tuning control signal VCseg, so that the slope of the adjusted segment tuning control signal VCseg' is not smaller than the slope of the gain variation of the IF amplifier 580, so that the waveform of the adjusted segment tuning control signal VCseg' is a sawtooth wave with hysteresis. Consequently, the disturbance immunity of the receiver 500 is improved, and the system gain unsteadiness due to unstable switches between neighboring amplifier unit 522's is avoided.

Figure 10A:
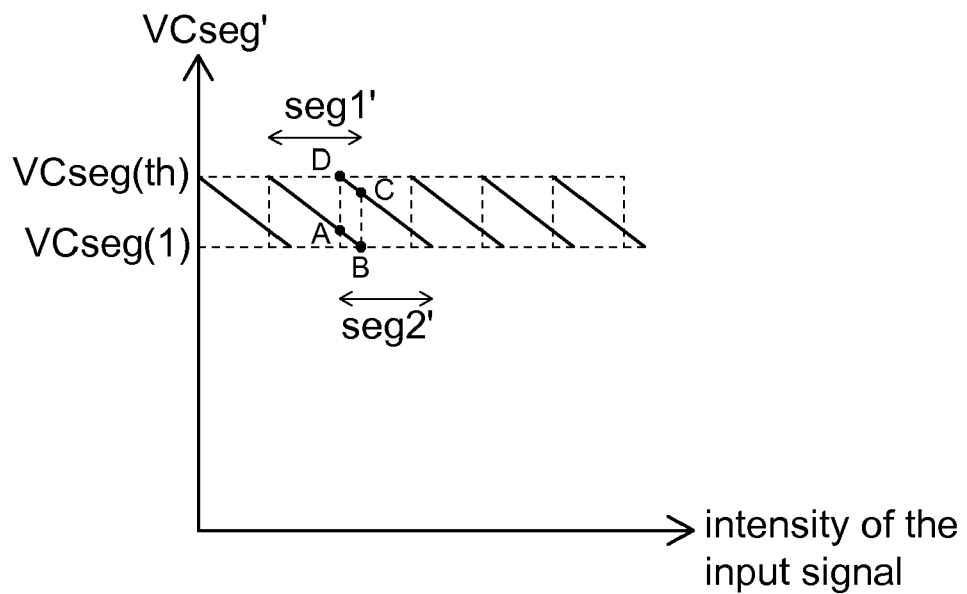
FIG. 10A shows a waveform of an example of the adjusted segment tuning control signal VCseg' with hysteresis corresponding to the segment tuning control signal VCseg of FIG. 9B.
Figure 10B:
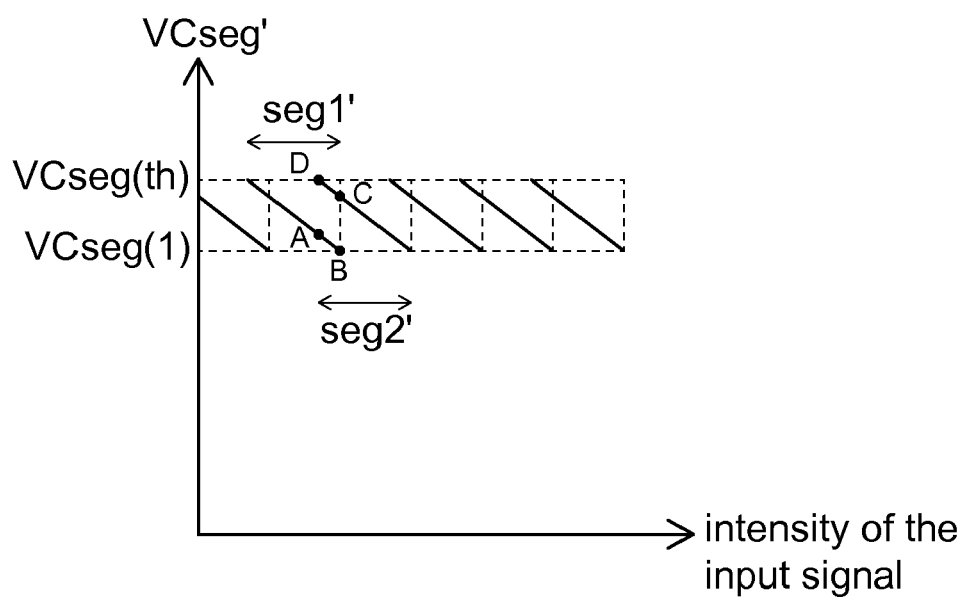
FIG. 10B shows a waveform of another example of the adjusted segment tuning control signal VCseg' with hysteresis corresponding to the segment tuning control signal VCseg of FIG. 9B.

FIG. 10A shows a waveform of an example of the adjusted segment tuning control signal VCseg' with hysteresis corresponding to the segment tuning control signal VCseg of FIG. 9B. FIG. 10B a waveform of another example of the adjusted segment tuning control signal VCseg' with hysteresis corresponding to the segment tuning control signal VCseg of FIG. 9B. Hysteresis means that the ranges of two adjacent segments are overlapped. Assume that the amplifier unit 522 corresponding to the current segment seg1' is selected. When the voltage of the gain control signal VC continuously lowers to VC(1) as the intensity of the input signal Vi increases (meanwhile, the level of the adjusted segment tuning control signal VCseg' corresponds to the point A of FIG. 10A), the control unit 540 still does not select the different amplifier unit 522. And not until the voltage of the gain control signal VC has continuously lowered to VC'(1) (meanwhile, the level of the adjusted segment tuning control signal VCseg' corresponds to the point B of FIG. 10A) will the amplifier unit 522 corresponding to the segment seg2' be selected, wherein the level of the adjusted segment tuning control signal VCseg' corresponds to the point C of FIG. 10A.

Likewise, the inverse operations are the same. Assume that the amplifier unit 522 corresponding to the segment Seg2' is selected. When the voltage of the gain control signal VC continuously boosts to VC'(1) as the intensity of the input signal Vi decreases (meanwhile, the level of the adjusted segment tuning control signal VCseg' corresponds to point C of FIG. 10A), the control unit 540 still does not select different amplifier unit 522. And not until the voltage of the gain control signal VC has continuously boosted to VC (1) (meanwhile, the level of the adjusted segment tuning control signal VCseg' corresponds to the point D of FIG. 10A), will the amplifier unit 522 corresponding to the segment seg1' be selected, wherein the adjusted segment tuning control signal VCseg' corresponds to the point A of FIG. 10A. Therefore, for the two adjacent segments seg1' and seg2' having partly-overlapped ranges, the operation of the receiver 500 has the same hysteresis protection effect within points A~D. The principles of FIG. 10B are similar to that of FIG. 10A, and are not repeated here.

Figure 11A:
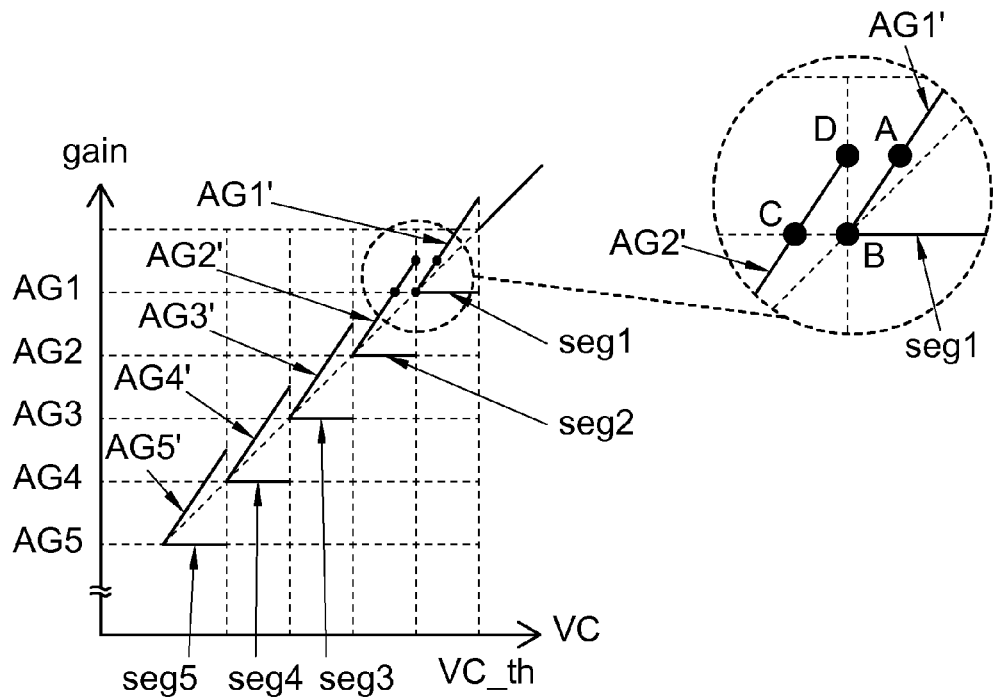
FIG. 11A shows a gain variation diagram of the receiver according to the exemplary embodiment consistent with the invention corresponding to the adjusted segment tuning control signal VCseg' of FIG. 10A.
Figure 11B:
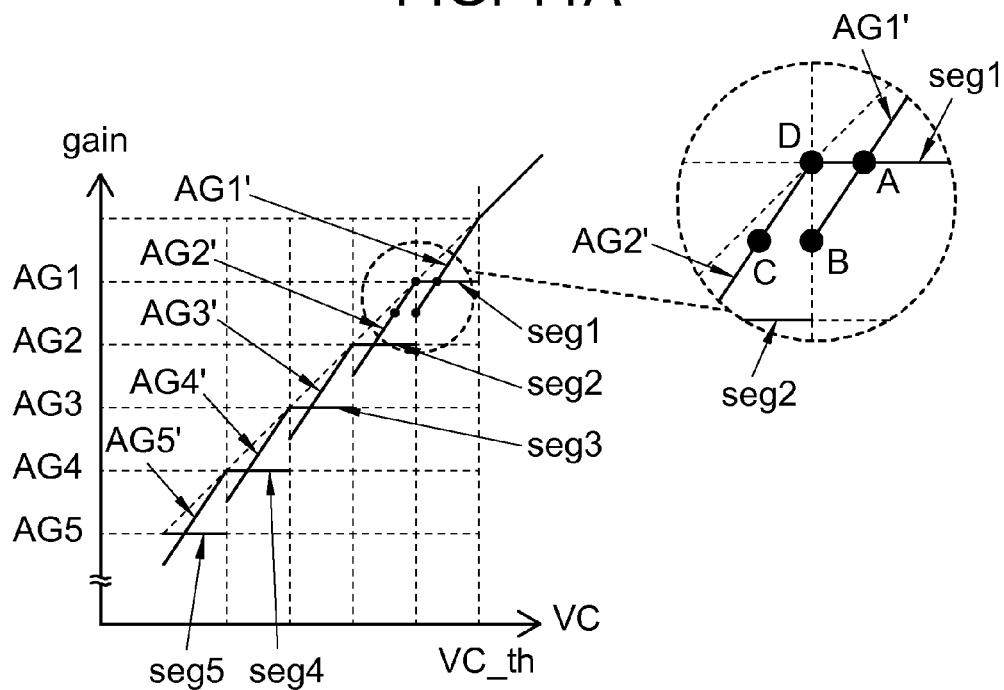
FIG. 11B shows a gain variation diagram of the receiver according to the exemplary embodiment consistent with the invention corresponding to the adjusted segment tuning control signal VCseg' of FIG. 10B.

FIG. 11A shows a gain variation diagram of the receiver according to the exemplary embodiment consistent with the invention corresponding to the adjusted segment tuning control signal VCseg' of FIG. 10A. FIG. 11B shows a gain variation diagram of the receiver according to the exemplary embodiment of the invention corresponding to the adjusted segment tuning control signal VCseg' of FIG. 10B. Referring to FIG. 11A and FIG. 11B, the amplifier module 520 at least has five amplifier units corresponding to the segments seg1 to seg5, and the five amplifier units have the step gains AG1 to AG5 for example. When the gain control signal VC is smaller than the gain threshold signal VC_th, the gain control system adjusts the variable gain of IF amplifier 580 to compensate for the gain vacancies between the step gains AG1 to AG5 and form the continuous gains AG1' to AG5' respectively.

For example, assume that the initial overall gain of the receiver is the minimum gain corresponding to AG1' (point B of FIG. 11A). When the input signal is disturbed and its intensity increases, the level of the gain control signal VC will slightly lower and make the amplifier module 520 be switched from the amplifier unit corresponding to the segment seg1 to the amplifier unit corresponding to the segment seg2. The overall gain of the receiver changes to a value slightly smaller than the gain corresponding to AG2' (corresponding to point C of FIG. 11A). Meanwhile, whatever disturbance which slightly lowers the intensity of the input signal and slightly increases the level of the gain control signal VC is not able to switch the amplifier module 520 from the amplifier unit corresponding to the segment seg2 to the amplifier unit corresponding to the segment seg1, hence forming a hysteresis protection effect.

Similarly, assume that the initial overall gain of the variable gain wide-dynamic-range amplifier is the largest gain of AG2' (point D of FIG. 11A). When the intensity of the input signal is disturbed and slightly steps down, the level of the gain control signal VC will slightly boost and make the amplifier module 520 be switched from the amplifier unit corresponding to segment seg2 to the amplifier unit corresponding to segment seg1. The overall gain of the receiver changes to a value slightly larger than the gain corresponding to AG1' (corresponding to point A of FIG. 11A). Meanwhile, whatever disturbance which slightly boosts the intensity of the input signal and slightly decreases the level of the gain control signal VC is not able to switch the amplifier module 520 from the amplifier unit corresponding to the segment seg1 to the amplifier unit corresponding to the segment seg2, hence forming a hysteresis protection effect. The principles of FIG. 10B are similar to that of FIG. 10A and are not repeated here.

As indicated in FIG. 11A and FIG. 11B, the operations of the receiver within points A~D virtually form a hysteresis protection effect which prevents the amplifier units of the amplifier module 520 from being unsteadily switched.

The receiver disclosed in the above embodiments of the invention has many advantages exemplified below.

The receiver of the invention controls and adjusts the amplifier module and the IF amplifier at the same time by use of the automatic gain control method. When the gain control signal is smaller than gain threshold signal, the step gains provided by the amplifier module maintain continuity because of the variable gain of the IF amplifier. When the gain control signal is larger than the gain threshold signal, the gain of the receiver is the sum of the largest gain provided by the amplifier module and the gain of the IF amplifier. Consequently, the receiver has the step gain variation and the continuous gain variation at the same, not only increasing the dynamic range of the input signal acceptable to the receiver but also reducing the required circuit elements and decreasing the circuit complexity. Besides, by adjusting the slope of the segment tuning control signal, the receiver has hysteresis protection and is capable of enhancing disturbance immunity and increasing system steadiness.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A receiver, comprising:
   an amplifier module, for amplifying an input signal, comprising a plurality of amplifier units which are coupled in parallel and have different gains;
   a control unit for enabling at least one of the amplifier units according to a gain control signal, wherein the enabled at least one amplifier unit generates an output RF signal in response to the input signal;
   a mixer coupled with each of the amplifier units in series and for down-converting the output RF signal to an IF signal according to a local oscillation frequency; and
   an IF amplifier with a variable gain coupled to the mixer for amplifying the IF signal to an output signal according to the gain control signal under the control of the control unit;
   wherein, the control unit obtains the gain control signal according to the output signal and a reference signal; and
   the control unit comprises:
   a pre-segmenting unit for receiving the gain control signal and generating a segment tuning control signal according to the gain control signal;
   a scale transformer for adjusting the segment tuning control signal, so that a slope of the segment tuning control signal is not smaller than a slope of the variable gain of the IF amplifier; and a selector for receiving the gain control signal and the segment tuning control signal, wherein when the gain control signal is smaller than a gain threshold signal, the selector outputs the segment tuning control signal for controlling the IF amplifier to amplify the IF signal, and when the gain control signal is larger than the gain threshold signal, the selector outputs the gain control signal for controlling the IF amplifier to amplify the IF signal.

2. The receiver according to claim 1, wherein the amplifier module comprises:
   a first amplifier circuit comprising a first differential amplifier for amplifying the input signal;
   a second amplifier circuit, comprising:
   a current source unit;
   a second differential amplifier, coupled to the current source unit, for amplifying the input signal; and
   a resistor module coupled to the second differential amplifier and comprising a plurality of major resistors and a plurality of major switches, each of the major switches being respectively and selectively conducted under the control of the control unit, the conducted major switch making currents flow through the corresponding major resistors, and a gain of the second differential amplifier being related to resistance of the major resistors that the currents flow through; and
   a selection unit for enabling one of the first differential amplifier and the second differential amplifier under the control of the control circuit, so that the enabled first differential amplifier or the enabled second differential amplifier outputs the output RF signal corresponding to the input signal.

3. The receiver according to claim 2, wherein the first differential amplifier has a first transistor and a second transistor, bases of the first transistor and the second transistor are used for receiving the input signal, and emitters of the first transistor and the second transistor are both coupled to a grounding voltage;
   wherein, the current source unit comprises a first current source and a second current source, the second differential amplifier comprises a third transistor and a fourth transistor, the major resistors comprises a plurality of first major resistors and a plurality of second major resistors, bases of the third transistor and the fourth transistor are used for receiving the input signal, emitters of the third transistor and the fourth transistor are respectively coupled to the first source and the second current source, the emitter of the third transistor is further coupled to the first major resistors, the emitter of the fourth transistor is further coupled to the second major resistors, and each of the first major resistors is electrically connected to one of the second major resistors through one of the major switches;
   wherein, collectors of the first transistor and the second transistor are respectively coupled to collectors of the third transistor and the fourth transistor for outputting the output RF signal.

4. The receiver according to claim 2, further comprising a signal input end and a matching unit, wherein the signal input end is used for receiving the input signal, and when the input signal is a single-end input signal, the matching unit is used for converting the single-end input signal to a double-end input signal, and the first differential amplifier and the second differential amplifier are used for amplifying the double-end input signal.

5. The receiver according to claim 1, wherein the control unit further comprises:
   a detector for detecting and obtaining a voltage level of the output signal;
   a comparator coupled to the detector for comparing a voltage level of the reference signal with that of the output signal; and
   a controller for generating the gain control signal according to a comparison between the voltage levels of the reference signal and the output signal.

6. The receiver according to claim 1, wherein when the gain control signal increases or decreases linearly along with a linear change in an intensity of the input signal, a waveform of the segment tuning control signal with respect to the intensity of the input signal is substantially a sawtooth wave.

7. The receiver according to claim 6, wherein the sawtooth wave having been adjusted by the scale transformer is a sawtooth wave with hysteresis.

8. The receiver according to claim 1, wherein the pre-segmenting unit comprises:
   an analog/digital converter for converting the gain control signal to a first signal;
   a digital/analog converter for converting the first signal to a second signal; and
   a subtractor used for subtracting the gain control signal by the second signal so as to generate the segment tuning control signal.

9. The receiver according to claim 1, wherein the pre-segmenting unit correspondingly outputs a plurality of enable signals for respectively enabling the amplifier units according to an intensity of the gain control signal.

* * * * *